United States Patent
Hikmet et al.

(10) Patent No.: US 9,631,793 B2
(45) Date of Patent: Apr. 25, 2017

(54) STACK OF LAYERS COMPRISING LUMINESCENT MATERIAL, A LAMP, A LUMINAIRE AND A METHOD OF MANUFACTURING THE STACK OF LAYERS

(71) Applicant: PHILIPS LIGHTING HOLDING B.V., Eindhoven (NL)

(72) Inventors: Rifat Ata Mustafa Hikmet, Eindhoven (NL); Ties Van Bommel, Horst (NL); René Theodorus Wegh, Veldhoven (NL); Paulus Albertus Van Hal, Waalre (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 264 days.

(21) Appl. No.: 14/409,026

(22) PCT Filed: Jul. 5, 2013

(86) PCT No.: PCT/IB2013/055511
§ 371 (c)(1),
(2) Date: Dec. 18, 2014

(87) PCT Pub. No.: WO2014/006597
PCT Pub. Date: Jan. 9, 2014

(65) Prior Publication Data
US 2015/0192273 A1    Jul. 9, 2015

Related U.S. Application Data

(60) Provisional application No. 61/668,052, filed on Jul. 5, 2012.

(51) Int. Cl.
*F21V 9/16* (2006.01)
*C09D 127/08* (2006.01)
(Continued)

(52) U.S. Cl.
CPC ............... *F21V 9/16* (2013.01); *B82Y 30/00* (2013.01); *C09D 127/08* (2013.01);
(Continued)

(58) Field of Classification Search
CPC ....... F21V 9/16; C09D 167/02; C09D 127/08; C09D 127/16; C09D 129/02; C09D 177/06; C09D 169/00
See application file for complete search history.

(56) References Cited

U.S. PATENT DOCUMENTS 7,839,072 B2    11/2010    Horiuchi et al.
7,957,434 B2    6/2011    Jang et al.
(Continued)

FOREIGN PATENT DOCUMENTS

EP    1947707 A1    7/2008
WO    2010116294 A1    10/2010
(Continued)

*Primary Examiner* — Joseph L Williams

(57) ABSTRACT

A stack of layers 100, a lamp, a luminaire and a method of manufacturing a stack of layers is disclosed. The stack of layers 100 comprises a first outer layer 102, a second outer layer 106 and a luminescent layer 104. The first outer layer 102 and the second outer layer 106 are of a light transmitting polymeric material and have an oxygen transmission rate lower than 30 cm3/(m2-day) measured under standard temperature and pressure (STP). The luminescent layer 104 is sandwiched between the first outer layer 102 and the second outer layer 106 and comprises a light transmitting matrix polymer and a luminescent material 108 being configured to absorb light according to an absorption spectrum and convert a portion of the absorbed light towards light of a light emission spectrum.

13 Claims, 6 Drawing Sheets

(51) Int. Cl.

| | | |
|---|---|---|
| *C09D 169/00* | (2006.01) | |
| *B82Y 30/00* | (2011.01) | |
| *F21S 8/06* | (2006.01) | |
| *F21V 3/04* | (2006.01) | |
| *H01J 1/63* | (2006.01) | |
| *H01J 1/68* | (2006.01) | |
| *C09D 127/16* | (2006.01) | |
| *C09D 129/02* | (2006.01) | |
| *C09D 167/02* | (2006.01) | |
| *C09D 177/06* | (2006.01) | |
| *F21K 9/232* | (2016.01) | |
| *F21K 9/27* | (2016.01) | |
| *F21K 9/64* | (2016.01) | |
| *H01L 33/50* | (2010.01) | |
| *F21Y 101/00* | (2016.01) | |

(52) U.S. Cl.
CPC ......... *C09D 127/16* (2013.01); *C09D 129/02* (2013.01); *C09D 167/02* (2013.01); *C09D 169/00* (2013.01); *C09D 177/06* (2013.01); *F21K 9/232* (2016.08); *F21K 9/27* (2016.08); *F21K 9/64* (2016.08); *F21S 8/06* (2013.01); *F21V 3/0481* (2013.01); *H01J 1/63* (2013.01); *H01J 1/68* (2013.01); *F21Y 2101/00* (2013.01); *H01L 33/505* (2013.01); *Y10T 428/3154* (2015.04); *Y10T 428/31507* (2015.04); *Y10T 428/31725* (2015.04); *Y10T 428/31786* (2015.04); *Y10T 428/31855* (2015.04); *Y10T 428/31935* (2015.04)

(56) References Cited

U.S. PATENT DOCUMENTS

| | | |
|---|---|---|
| 2011/0037926 A1 | 2/2011 | Tsukahara |
| 2012/0001204 A1 | 1/2012 | Jagt |

FOREIGN PATENT DOCUMENTS

| | | |
|---|---|---|
| WO | 2011140353 A2 | 11/2011 |
| WO | 2011158144 A1 | 12/2011 |
| WO | 2012001645 A1 | 1/2012 |
| WO | 2012085780 A1 | 6/2012 |

STACK OF LAYERS COMPRISING LUMINESCENT MATERIAL, A LAMP, A LUMINAIRE AND A METHOD OF MANUFACTURING THE STACK OF LAYERS

CROSS-REFERENCE TO PRIOR APPLICATIONS

This application is the U.S. National Phase application under 35 U.S.C. §371 of International Application No. PCT/IB13/055511, filed on Jul. 5, 2013, which claims the benefit of U.S. Provisional Patent Application No. 61/668,052, filed on Jul. 5, 2012. These applications are hereby incorporated by reference herein.

FIELD OF THE INVENTION

The invention relates to a stack of layers comprising a layer with a luminescent material.

BACKGROUND OF THE INVENTION

In many lighting applications the use of luminescent material in a remote configuration is suggested. Many luminescent materials, and more in particular organic phosphors, have a problem associated with photo-chemical stability. Especially organic phosphors deteriorate when being illuminated and when they are exposed to oxygen. In order to prevent fast deterioration of the material, a protection against oxygen is required. Thus, in order to guarantee a reasonable life time of a light source in which such luminescent materials are used, the luminescent material must be protected against oxygen.

Other luminescent materials, like quantum dots, are also sensitive for oxygen and detoriate under the influence of oxygen even without being illuminated.

In U.S. Pat. No. 7,839,072 a solution is proposed to protect organic phosphors against environmental air. The document discloses a translucent laminate sheet which includes at least one type of organic phosphor which is configured to convert light to another color and two light-transmitting members to seal the organic phosphor. The light-transmitting members are two parallel arranged plates and the organic phosphor is disposed to be held between them. At the circumference of the two plates, the opening between the two plates is hermetically sealed to prevent the deterioration of the organic phosphor under the influence of environmental air. The two plates are made of glass.

The translucent laminate sheet of the cited patent is a relative expensive solution for protecting the organic phosphors. The use of glass and the requirement to hermetically seal the opening between the glass plates at the circumference of the two plates result in a relatively expensive manufacturing process and the use of relatively expensive materials. Further, the use of glass results in a non-flexible configuration and the translucent laminate sheet has a flat shape.

SUMMARY OF THE INVENTION

It is an object of the invention to provide a cost effective solution for protecting a layer with luminescent material against the influence of environmental oxygen.

A first aspect of the invention provides a stack of layers. A second aspect of the invention provides a lamp, a third aspect of the invention provides a luminaire and a fourth aspect of the invention provides a method of manufacturing a stack of layers. Advantageous embodiments are defined in the dependent claims.

A stack of layers in accordance with the first aspect of the invention comprises a first outer layer, a second outer layer and a luminescent layer. The first outer layer and the second outer layer are of a light transmitting polymeric material and have an oxygen transmission rate lower than 30 $cm^3/(m^2 \cdot day)$ measured under standard temperature and pressure (STP). The luminescent layer is sandwiched between the first outer layer and the second outer layer and comprises a light transmitting matrix polymer and a luminescent material being configured to absorb light according to an absorption spectrum and convert a portion of the absorbed light towards light of a light emission spectrum.

Providing luminescent material in a matrix polymer in the luminescent layer is a first measure to protect the luminescent material against the influence of environmental air, and more specific, the oxygen in the air. However, the luminescent material, which is present close to the surface of the matrix polymer material, will still receive too much oxygen and will deteriorate. A second measure is the use of two light transmitting layers with barrier properties. By sandwiching the luminescent layer between those two layers, the luminescent material within the luminescent layer is exposed to less oxygen. The two layers with barrier properties form the first outer layer and the second outer layer of the stack of layers and the two outer layers are made of a light transmitting polymeric material. Thus, light may be transmitted through the outer layers. The barrier properties of the outer layers mainly relate to the permeability of the layer for oxygen. The oxygen transmission rate of the first outer layer and of the second outer layer is lower than 30 $cm^3/(m^2 \cdot day)$ under standard temperature and pressure conditions (STP, defined by IUPAC as T=273.15K and p=1 bar) and if the oxygen transmission rate is lower than this value, the amount of oxygen which may penetrate through one or more layers of the stack towards the luminescent material is significantly reduced. Thus, the luminescent layer will have a relatively long life time.

Note that the oxygen transmission rate is the oxygen transmission rate of the layer, which means that, independently of the thickness of the layer, the oxygen transmission rate should be below the specified value. Thus, under standard temperature and pressure conditions, not more than 30 $cm^3$ of oxygen may be transferred through the 1 $m^2$ of such a layer per day. In literature standard measurement setups may be found to measure the transmission rate of a specific gas through a layer. Each material has a specific oxygen permeability which is in general specified by the unit $cm^3 \cdot mm/(m^2 \cdot day \cdot bar)$. Thus, the thickness of the layer relates the oxygen transmission rate to the oxygen permeability of the material of which the layer is manufactured and to the pressure difference.

The term 'sandwiched between' means that the luminescent layer is in between the first outer layer and the second outer layer and that the luminescent layer is applied to these outer layers. It may include situations in which the layers are in direct contact with each other, and may include the use of an adhesive which couples the layers to each other. Other terms that describe the same configuration are: the luminescent layer is coated on opposite sides with the respective outer layers, or the respective outer layers are laminated to opposite sides of the luminescent layer.

Using a matrix polymer and a light transmitting polymeric material results in several advantages. Suitable materials have a low price and may, thus, result in a cost effective solution for protecting luminescent material. Further, manufacturing method for manufacturing the stack of layers is relatively cheap—the use of polymeric materials allows, for example, the use of co-injection molding and of co-extrusion. Co-injection molding and co-extrusion are a relative cost-effective production method for manufacturing sheets which comprise different layers. Thus, besides the cost-advantage based on the used materials, the suitable manufacturing method leads to an additional cost advantage.

Other advantages of the use of polymeric material are: the stack of layers can be made flexible, which is advantageous in application wherein the stack of layers is, for example, used in a curved configuration; the stack of layers can also be manufactured in different shapes, such as, for example, the shape of the surface of a tube, the shape of the surface of a sphere, or the shape of a lens. Thus, in addition to the light converting properties of the luminescent material, the stack of layers may be configured to have specific light refraction characteristics.

Further, the matrix polymer and the light transmitting polymeric material allow an easy cutting of the stack of layers and relatively efficient specific shapes can be cut out of a large sheet of the stack of layers according to the invention. One may, for example, cut circular shapes out of the large sheet for being used in a lamp or luminaire. Alternative techniques for (hermitically) sealing a layer with a luminescent material induce much higher manufacturing costs when such shapes must be manufactured. Further, when the cutting is done by heat, the material of the first outer layer and the second outer layer is welded to each other and automatically forms a sealing at the cutting edges.

In this context it is to be noted that the used terms "stack" and "layer(s)" do not imply that the claimed stack of layers is flat (follows a flat plane). The use of the term layer implies that the layer is relatively thin compared to its width and length. The term stack implies that two or more layers (in this specific case, three or more layers) are arranged on top of each other. "Layers which are arranged on top of each other" implies that the thinnest dimension of the layers (the thickness) is, locally, arranged in the same direction. In the stack, the layers are not by definition of the same size. In the stack of layers of the invention the luminescent layer is at least sandwiched in between the first outer layer and the second outer layer, which implies that the luminescent layers has the same size (width/length) as the respective outer layers, or is smaller than one or more of the outer layers. The thickness of the layers in the stack of layers may be different.

In this context, the absorption spectrum and light emission spectrum may, for example, comprise a primary color having a specific bandwidth around a predefined wavelength, or may, for example, comprise a plurality of primary colors. In this context, the spectra may also include non-visible light, such as ultraviolet light. The light of a primary color, for example, includes Red, Green, Blue, Yellow and Amber light. Light of the spectra may also comprise mixtures of primary colors, such as Blue and Amber, or Blue, Yellow and Red.

The polymeric material of the first outer layer and the second outer layer and of the matrix polymer are at least light transmitting, which means that at least a portion of the light, which impinges on the material, is transmitted through the material and is emitted into the ambient. Thus, the stack of layers may be fully or partially transparent, or may be translucent. In an embodiment, the light transmitting materials transmit at least 80% of the light which penetrates into the material, and only a limited amount of light is absorbed in the stack of layers.

Optionally, the material of the first outer layer and the material of the second outer layer have an oxygen permeability lower than 3 $cm^3 \cdot mm/(m^2 \cdot day \cdot bar)$. Which materials having such a low oxygen permeability it is relatively easy to manufacture stacks of layers of which the first outer layer and the second outer layer have an oxygen transmission rate which is lower than 30 $cm^3/(m^2 \cdot day)$ under standard temperature and pressure (STP).

Optionally, the luminescent material comprises at least one of an organic phosphor, a quantum dot, a quantum rod or a quantum tetrapod. Organic phosphors deteriorate relatively fast under the influence of oxygen and light. In the stack of layers the organic phosphors are well protected against oxygen against relatively low costs. Quantum dots, quantum rods and quantum tetrapods deteriorate under the influence of oxygen and, thus, the first outer layer and the second outer layer provide an advantageous protection layer for these luminescent materials. The quantum dots, quantum rods and quantum tetrapods are particles showing quantum confinement and have at least in one dimension a size in the nanometer range. Quantum confinement means that the particles have optical properties that depend on the size of the particles.

Organic phosphors have a high quantum efficiency and are often transparent, which prevents undesired scattering and increases efficiency. Organic luminescent materials have more advantages. The position and the bandwidth of the luminescence spectrum can be designed with ease to be anywhere in the visible range. As such it is relatively easy to manufacture a light source which emits white light with high efficacy.

Optionally, the luminescent layer comprises a further luminescent material which is configured to absorb light according to a further absorption spectrum and convert a portion of the absorbed light towards light of a further light emission spectrum. Thus, more than one luminescent material is provided in the luminescent layer and the stack of layers also provides an effective and cost efficient protection against oxygen for the further luminescent material. Further, the use of more than one luminescent material allows the generation of more colors of light and, thus, of light emissions with a higher color rendering index.

Optionally, the luminescent material and the further luminescent material are provided as a mix of materials in a single layer. Alternatively, the luminescent material is provided in a first sub-layer and the further luminescent material is provided in a second sub-layer. The sub-layers form the luminescent layer. Further, in the luminescent layer, two or more different luminescent materials may be separated in space within the luminescent layer, for example, in the form of pixels of one specific color.

Optionally, the light transmitting polymeric material comprises at least one of: poly ethylene terephthalate (PET), poly ethylene naphtalate (PEN), poly vinylidene chloride (PVDC), poly vinylidene fluoride (PVDF), ethylene vinyl alcohol (EVOH), polybutylene terephthalate (PBT), poly acrylo nitrile (PAN) and nylon6 (PA6). The materials of this optional embodiment are light transmitting and in most cases transparent. Further, they have a relatively low oxygen permeability which is lower than 3 $cm^3 \cdot mm/(m^2 \cdot day \cdot bar)$. Thus, the materials are an effective barrier for protecting the luminescent material of the luminescent layer against oxygen. It is to be noted that instead of the term nylon6 the term polycaprolactam may also be used.

Optionally, the matrix polymer comprises at least one of: poly ethylene terephthalate (PET), poly methylmethacrylate (PMMA), poly carbonate (PC). These materials are light transmitting and it is relatively easy to manufacture a layer of these materials which contains luminescent material. The cost price of these materials is relatively low.

Optionally, the light transmitting polymeric material and the matrix polymer comprise the same polymeric material Optionally, the light transmitting polymeric material and the matrix polymer comprises poly ethylene terephthalate (PET). PET is a relatively cheap material which forms a sufficient barrier for oxygen in the stack of layers according to the first aspect of the invention. Further, if all layers have the same polymeric material, it is even more efficient to manufacture the stack of layers compared to a situation wherein the material of the respective outer layers is different from the matrix polymer of the luminescent layer. Further, the interface between the different layers will be an interface between layers with an equal refractive index and, consequently, no refraction or undesired reflection occurs at the interface between the different layers.

Optionally, the first outer layer and/or the luminescent layer further comprises particles of at least one of the groups of scattering particles, lifetime improvement particles and inorganic phosphors. In specific applications, in order to obtain specific effects, it is desired to have scattering particles in the stack of layers to obtain a diffuse light emission by the stack of layers. Further, the use of inorganic phosphors results in the generation of an additional color of light and a potentially higher color rendering index. Examples of lifetime improvement particles are getters which absorb, for example, oxygen which penetrates through one or more layers of the stack of layers—and, thus, the life time of the luminescent material in the luminescent layer is increased. Getters are a reactive material which absorb other materials (such as gasses) via a chemical reaction.

According to a second aspect of the invention, a lamp is provided which comprises a light emitter and a stack of layers according to the first aspect of the invention. The stack of layers is arranged to receive light from the light emitter.

According to a third aspect of the invention, a luminaire is provided which comprises a stack of layers according to the first aspect of the invention or comprises a lamp according to the second aspect of the invention.

The lamp and the luminaire, respectively according to the second aspect and the third aspect of the invention, provide the same benefits as the stack of layers according to the first aspect of the invention and have similar embodiments with similar effects as the corresponding embodiments of the stack According to a fourth aspect of the invention, a method of manufacturing a stack of layers is provided. The method comprises the steps of i) manufacturing a luminescent layer of a matrix polymer comprising luminescing material—the luminescent material is configured to absorb light according to an absorption spectrum and convert a portion of the absorbed light towards light of a light emission spectrum; ii) applying a first outer layer and applying a second outer layer on both sides of the luminescent layer—the first outer layer and the second outer layer are of a light transmitting polymeric material and have an oxygen transmission rate lower than 30 cm$^3$/(m$^2$·day) (STP).

The manufacturing of the luminescent layer may comprise the sub steps of mixing luminescent material with the matrix polymer and manufacturing a layer of the mix. Creating a layer may be done by using an extrusion process, by injection molding or by spreading the mix along a surface and curing the mix. The step of applying the first outer layer and applying the second outer layer on both sides of the luminescent layer may be performed by using lamination techniques, co-injection molding or co-extrusion.

The discussed techniques for performing the steps of the method of manufacturing the stack of layers are relatively cheap production technologies and, thus, may result in a relatively cheap stack of layers.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the stack and/or the method, which correspond to the described modifications and variations of the stack, can be carried out by a person skilled in the art on the basis of the present description.

Figure 1:
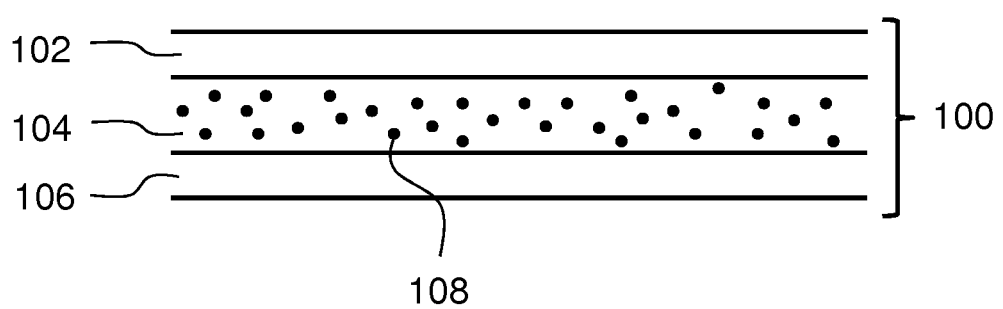
FIG. 1 schematically shows in a cross-sectional view an embodiment of a stack of layers, FIG. 2 schematically shows the reduced deterioration as the result of the use of the first outer layer and the second outer layer, FIG. 3 schematically shows different examples of stacks of layers falling within the scope of the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

FIG. 1 schematically shows in a cross-sectional view an embodiment of a stack 100 of layers 102 . . . 106. The presented view is only a portion of a large cross-section of, for example, a large sheet which is formed by the stack 100 of layers 102 . . . 106. The stack 100 of layers comprises a luminescent layer 104 which comprises particles or molecules 108 of a luminescent material. The particles or molecules 108 of a luminescent material are embedded in a light transmitting matrix polymer which forms the luminescent layer 104. The particles or molecules 108 of a luminescent material are configured to absorb light according to an absorption spectrum when light impinges on them and are configured to convert a portion of the absorbed light towards light of a light emission spectrum. The light emission spectrum is different from the light absorption spectrum and, thus, the luminescent material converts light of a specific color to light of another specific color. The stack 100 of layers further comprises a first outer layer 102 and a second outer layer 106. The first outer layer 102 and the second outer layer 106 are both manufactured of a light transmitting polymeric material which has an oxygen transmission rate that is lower than 30 cm$^3$/(m$^2$·day) under standard temperature and pressure (STP). Thus, oxygen in the environmental air may penetrate through the outer layer 102, 106, but only to a limited extend. A limited amount of oxygen is able to penetrate to the particles or molecules 108 of luminescent material, and, thus, deterioration of the luminescent material of the particles or molecules 108 is reduced and the life-time of products using the luminescent material for the conversion of the color of light is increased.

When the luminescent material is an organic phosphor, such as for example a perylene derivative, the luminescent material is present in the form of molecules 108. Luminescent materials based on perylene derivatives are sold by BASF under the name Lumogen. The luminescent material may also be particles 108 such as quantum dots, quantum rods and quantum tetrapods. The quantum dots, quantum rods and quantum tetrapods are particles showing quantum confinement and have at least in one dimension a size in the nanometer range. Quantum confinement means that the particles have optical properties that depend on the size of the particles.

Oxygen transmission rate (OTR) is the volume of oxygen gas passing through a unit area (m$^2$) of the parallel surfaces of a film/layer/sheet per unit time (day) when the pressure difference between the two sides of the film is 1 bar. The OTR is related to the oxygen permeability P coefficient of a polymer by ORT·d=P, wherein d is the film thickness. Advantageous materials to be used as the matrix polymer of the luminescent layer 104 are: poly ethylene terephthalate (PET), poly methylmethacrylate (PMMA), poly carbonate (PC). Advantageous material to be used for the first outer layer 102 and the second outer layer 106 are: poly ethylene terephthalate (PET—oxygen permeability: 3 cm$^3$·mm/(m$^2$·day·bar), and thus the oxygen transmission rate of 0.1 mm thick amorphous PET is at room temperature 30 cm$^3$/(m$^2$·day)), poly ethylene naphtalate (PEN—oxygen permeability: 0.6 cm$^3$·mm/(m$^2$·day·bar)), poly vinylidene chloride (PVDC—oxygen permeability: 0.2 cm$^3$·mm/(m$^2$·day·bar)), poly vinylidene fluoride—(PVDF—oxygen permeability: 0.2 cm$^3$·mm/(m$^2$·day·bar)), ethylene vinyl alcohol (EVOH 32%—oxygen permeability: 0.004 cm$^3$·mm/(m$^2$·day·bar)), poly acrylo nitrile (PAN—oxygen permeability: 0.2 cm$^3$·mm/(m$^2$·day·bar)) and nylon6 (polycaprolactam, oxygen permeability: 1.5 cm$^3$·mm/(m$^2$·day·bar)). For PET a minimum layer thickness of 100 micrometer is sufficient to give the desired protection. In case of materials with a lower permeability, the minimum layer thickness may be lower accordingly. It is also possible to use other materials with a higher permeability and just increase the thickness of the layer. However, for practical reasons, it is not always to have relatively thick layers which limit the flexibility and may possibly absorb to much light.

According to a specific embodiment, the same material is used for the matrix polymer of the luminescent layer 104 as for the first outer layer 102 and the second outer layer 106. In an advantageous embodiment, the matrix polymer and the material of the first outer layer 102 and the second outer layer 106 are PET.

Figure 2:
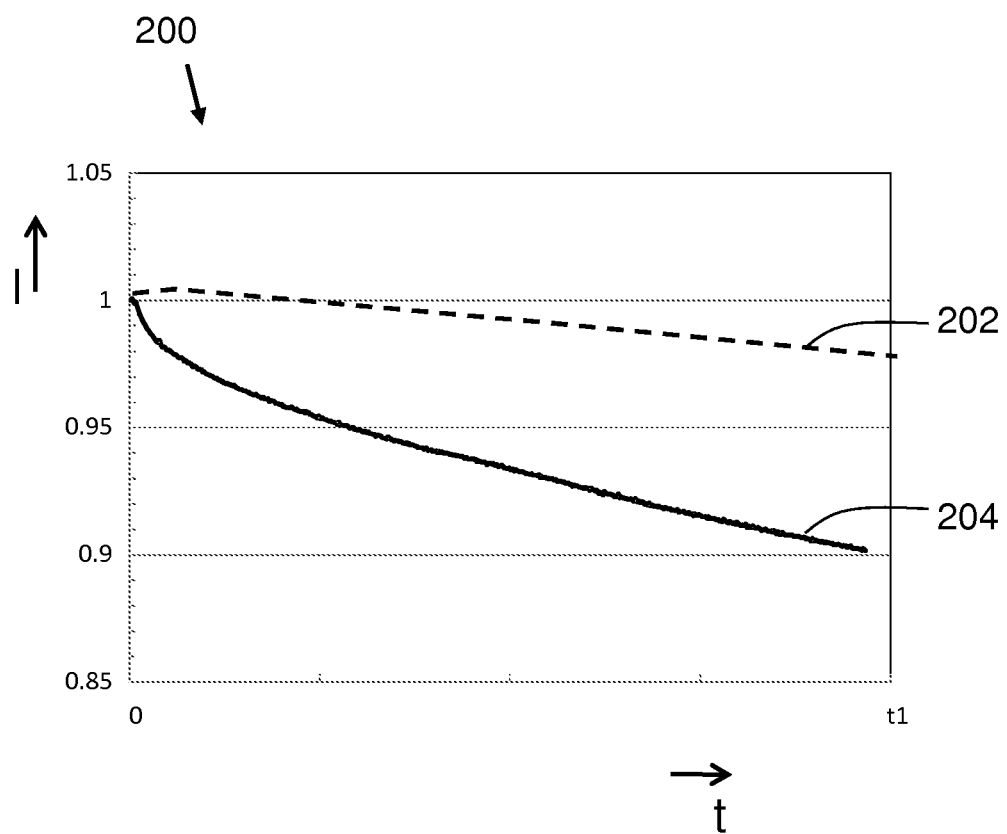

The effect of the reduced deterioration of the luminescent material is presented in FIG. 2 which schematically shows, in chart 200, a comparison between a luminescent layer 104 with and without outer layers 102, 106. The x-axis of the chart 200 represents time. The y-axis represents the normalized intensity. Two different situations are tested. A first line 204 represents the situation in which an organic phosphor is provided in a PMMA matrix layer. This layer was exposed by blue light with a flux density of 2 W/cm$^2$ at 60 degrees Celsius. A reduction of 10% is measured after a time period t1. The second line 202 represents the situation in which the PMMA layer with the organic phosphor is sandwiched between, which means, laminated with two layers of 100 micrometer transparent poly ethylene terephthalate (PET) foils. After the time period t1 a reduction of intensity of only 2% is measured, which is a significant improvement.

Figure 3:
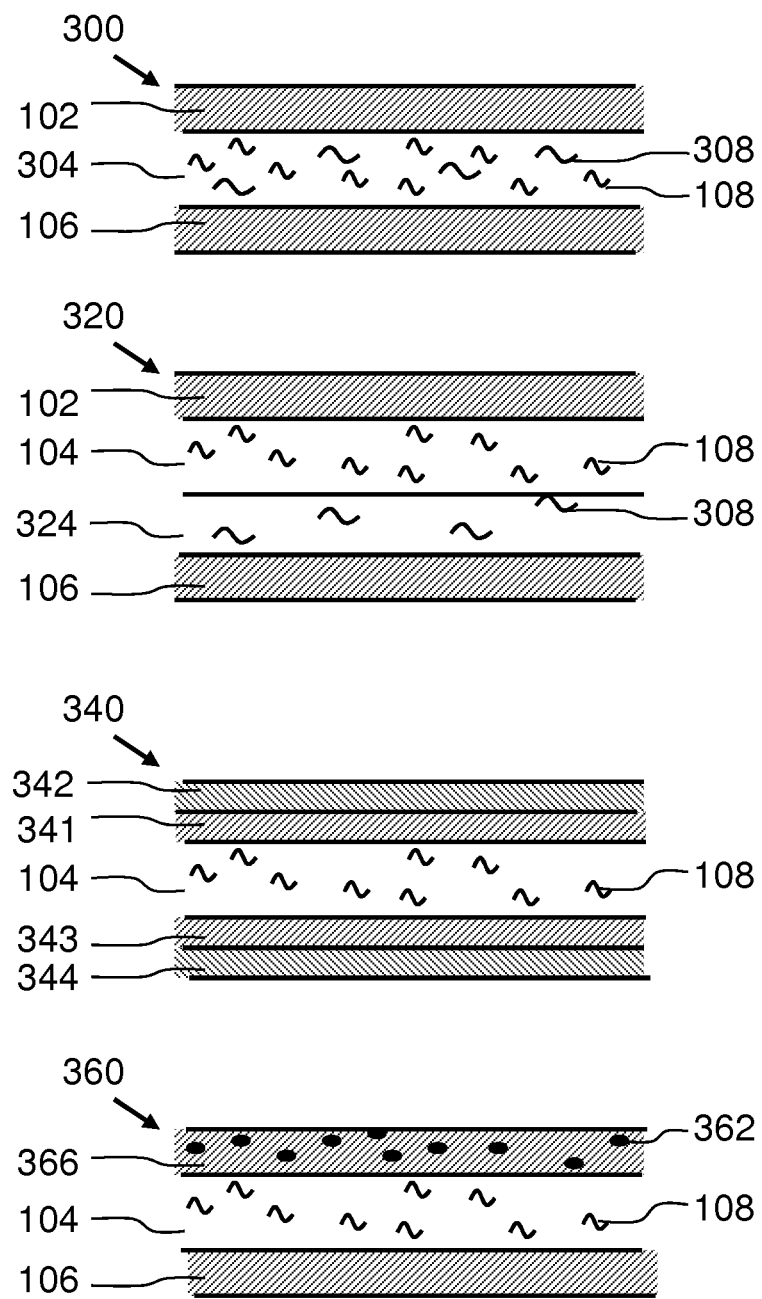

FIG. 3 schematically shows different examples of stacks of layers falling within the scope of the invention.

A first example is the stack 300 of layers. The stack 300 of layers is similar to the stack 100 of layers of FIG. 1. The difference is that instead of the luminescent layer 104 with a single luminescent material, the stack 300 of layers comprises a luminescent layer 304 in which at least two different particles or molecules 108, 308 of luminescent material are embedded. An example is a combination of molecules 108 of an organic phosphor and particles 308 of an inorganic phosphor. In another embodiment, two different types of organic molecules 108, 308 are present in the luminescent layer 304.

A second example is the stack 320 of layers. The stack 320 of layers is similar to the stack 300 of layers of FIG. 3. Instead of a mix of molecules 108 of an organic phosphor and particles 308 of an inorganic phosphor, the different molecules/particles 108, 308 are arranged in separate luminescent layers 104, 324. The luminescent layer 104 is of a matrix polymer in which molecules 108 of an organic luminescent material are dispensed. A further luminescent layer 324 is of the same, or another, matrix polymer in which particles 308 of an inorganic luminescent material are dispensed. In another embodiment, the further luminescent layer 324 comprises molecules 308 of another organic luminescent material. The luminescent layer 104 and the further luminescent layer 324 are arranged on top of each other, and the combination of the two luminescent layer 104, 324 is sandwiched in between the first outer layer 102 and the second outer layer 106. The first outer layer 102 and the second outer layer 106 are already discussed in the context of FIG. 1.

A third example is the stack 340 of layers which comprises the luminescent layer 104 as discussed in the context of FIG. 1, and which comprises four layers 341, 342, 346, 346. At one side of the luminescent layer 104, a first layer 341 is applied and on top of this first layer 341a second layer 342 is applied. At another side of the luminescent layer 104, a third layer 343 is applied which is subsequently laminated with a fourth layer 344. Thus, seen in a direction perpendicular to the stack, the subsequent layers are applied on top of each other: the second layer 342, the first layer 341, the luminescent layer 104, the third layer 343 and the fourth layer 344. At least the first layer 341 and the second layer 342 are made of a light transmitting polymeric material and have an oxygen transmission rate lower than 30 cm$^3$/(m$^2$·day) (STP). In an embodiment, the second layer 342 and the fourth layer 344 are also made of a light transmitting polymeric material and have an oxygen transmission rate lower than 30 cm$^3$/(m$^2$·day) (STP). In this last embodiment, the luminescent layer 104 is protected on both sides, with two layers which prevent the transmission of large amounts of oxygen towards the luminescent layer 104, and, consequently, is the luminescent layer 104 better protected against the influence of oxygen. However, in another embodiment, the second layer 342 and the fourth layer 344 are of another light transmitting material (and do not necessarily have an oxygen transmission rate lower than 30 cm$^3$/(m$^2$·day) (STP).

The second layer 342 and the fourth layer 344 are, for example, a (polymeric) color filter.

A fourth example is the stack 360 of layers which is similar to the stack 100 of layers of FIG. 1, however, instead of the first outer layer, the stack 360 of layers has a first outer layer 366 which comprises particles 362. Further, the first outer layer 366 is also made of a light transmitting polymeric material and has an oxygen transmission rate lower than 30 cm$^3$/(m$^2$·day) (STP). The particles 362 which are encapsulated in the light transmitting polymeric material are at least one of: particles of at least one of the groups of scattering particles, lifetime improvement particles and inorganic phosphors. In specific applications, in order to obtain specific effects, it is desired to have scattering particles in the stack of layers 360 to obtain a diffuse light emission by the stack 360 of layers and diffuse light transmission through the stack 360 of layers. Examples of scattering materials are titanium dioxide, zirconium oxide or aluminum oxide particles or a mixture thereof. The use of inorganic phosphors results in the generation of additional colors of light and a potentially higher color rendering index. Examples of lifetime improvement particles are getters which absorb, for example, oxygen which penetrated through one or more layers of the stack 360 of layers—and, thus, the life time of the molecules or particles 108 of luminescent material in the luminescent layer 104 is increased. Getters are a reactive material which absorb other materials (such as gasses) via a chemical reaction.

The examples of stacks 100, 300, 320, 340, 360 of layers illustrate the stack of layers according to the first aspect of the invention. The invention is not limited to these individual embodiments only and other combinations of features of the stacks 100, 300, 320, 340, 360 can also be made by the skilled person and still fall within the scope of the invention.

It is to be noted that, in the examples of the stacks 100, 300, 320, 340, 360 of layers, instead of an organic luminescent material or an inorganic luminescent material other luminescent materials may be used as well, such as quantum dots, quantum rods or quantum tetrapods.

There is a nearly unlimited assortment of suitable organic luminescent materials or dyes. Relevant examples are perylenes (such as dyes known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, and dyes such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other dyes, such as acid dyes, basic dyes, direct dyes and dispersion dyes may be used as long as they show a sufficiently high fluorescence quantum yield for the intended use. Hence, on or more of the luminescent moieties may comprise perylene groups. Especially, one or more luminescent moieties are configured to generate red luminescence upon excitation by blue and/or UV light.

Dependent upon the type of light of the light source (see above), the luminescent moieties may for instance comprise a combination of green and red emitting materials, or a combination of yellow and red emitting luminescent materials, etc. In case a light source is applied that (predominantly) generates UV light, a combination of blue, green and red emitting luminescent moieties, or a combination of blue, yellow and red emitting luminescent moieties, etc., may be applied.

The inorganic luminescent material may comprises a yellow emitting in organic phosphor, such as YAG and/or LuAG, or a red inorganic phosphor such as ECAS and/or BSSN. Other examples of inorganic luminescent materials may include, but are not limited to, cerium doped yttrium aluminum garnet (Y3Al5O12:Ce3+, also referred to as YAG:Ce or Ce doped YAG) or lutetium aluminum garnet (LuAG, Lu3Al5O12), —SiAlON:Eu2+ (yellow), and M2Si5N8:Eu2+ (red) wherein M is at least one element selected from calcium Ca, Sr and Ba. Another example of an inorganic phosphor that may be used in embodiments of the invention, typically in combination with a blue light emitting light source, is YAG:Ce. Furthermore, a part of the aluminum may be substituted with gadolinium (Gd) or gallium (Ga), wherein more Gd results in a red shift of the yellow emission. Other suitable materials may include (Sr1xyBaxCay)2zSi5aAlaN8aOa:Euz2+ wherein 0·a<5, 0·x·1, 0·y·1 and 0<z·1, and (x+y)·1, such as Sr2Si5N8:Eu2+ which emits light in the red range.

In embodiments of the invention the luminescent materials may comprise quantum dots. Quantum dots are small crystals of semiconducting material generally having a width or diameter of only a few nanometers. When excited by incident light, a quantum dot emits light of a color determined by the size and material of the crystal. Light of a particular color can, therefore, be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphode (InP), and copper indium sulfide (CuInS2) and/or silver indium sulfide (AgInS2) can also be used. Quantum dots show very narrow emission band and thus they show saturated colors. Furthermore, the emission color can easily be tuned by adapting the size of the quantum dots. Any type of quantum dot known in the art may be used in the present invention, provided that it has the appropriate wavelength conversion characteristics.

Figure 4A:
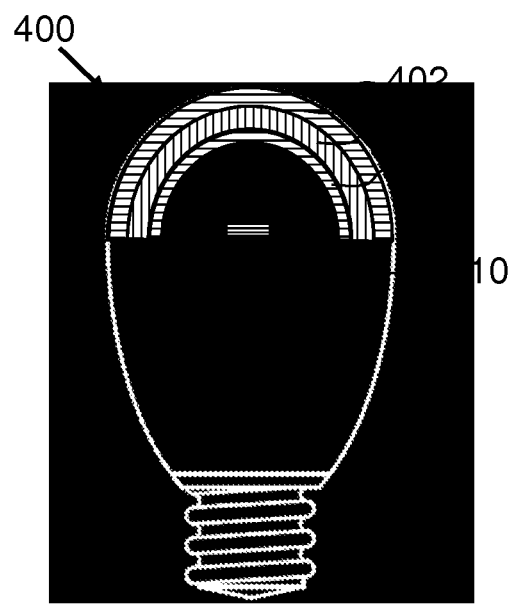
FIG. 4a and FIG. 4b present examples of a lamp comprising a stack of layers.
Figure 4B:
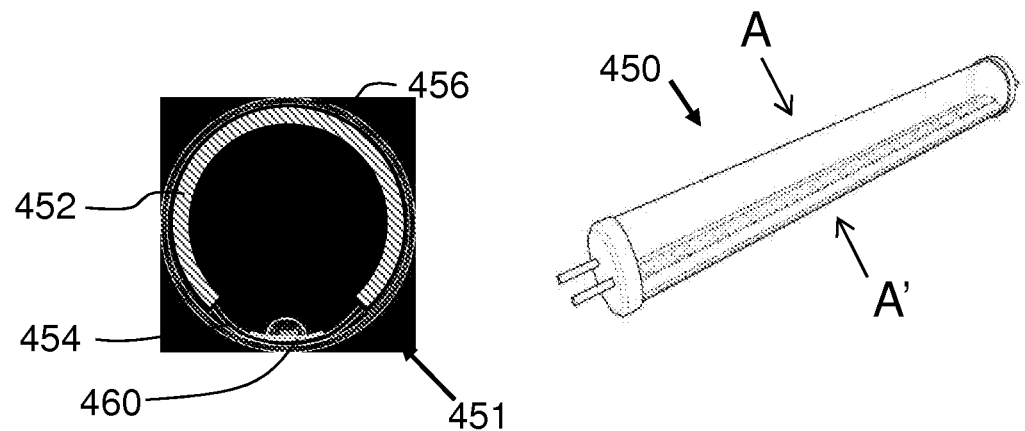

FIG. 4a and FIG. 4b present examples of a lamp 400, 450 comprising a stack of layers. In FIG. 4a a cross-sectional view of lamp 400 is presented. The lamp 400 is a LED lamp and has the same envelope as a traditional light bulb. Lamp 400 comprises a Light Emitting Diode 410 (LED) which emits light towards a stack of layers 402, 404, 406. The stack of layers 402, 404, 406 is similar to the stack 100 of layers of FIG. 1, however, the shape of the stack of layer 402, 404, 406 is not flat, but curved and follows the shape of the light exit window of the lamp 400. The first outer layer 402 and the second outer layer 406 are made of a light transmitting polymeric material and have an oxygen transmission rate lower than 30 cm$^3$/(m$^2$·day) (STP). The luminescent layer 404, which is sandwiched between the first outer layer 402 and the second outer layer 406, is made of a light transmitting matrix polymer and comprises a luminescent material which is configured to absorb light according to an absorption spectrum and to convert a portion of the absorbed light towards light of a light emission spectrum.

FIG. 4b shows at the right end a three dimensional view of light tube 450 and at the left ends a cross-sectional view of the light tube 450 along lines A-A'. In the cross-sectional view, an outer glass layer 456 of the light tube 450 is shown. A large portion of the glass layer 456 is configured as a light exit window. At a specific position within the glass layer 456 is provided a reflector 454 on top of which a light source 460 comprising a Light Emitting Diode (LED) is arranged. The light source 460 emits light towards the light exit window. Inside the light tube 450, a stack 452 of layers according to the first aspect of the invention is arranged at the light exit window formed by the layer of glass 456. The stack 452 of layer is has a curved shape and the layer of the stack 452 follow the curvature of the layer of glass 456. The individual layers of the stack 452 are not shown. The layers of the stack 452 are for example similar to the layers of the stack 100 of layer of FIG. 1; the stack 452 is formed by a first outer layer, a second outer layer and a luminescent layer sandwiched between the first outer layer and the second outer layer. Light which is emitted by the light source 460 first reaches the second outer layer, than the luminescent layer and is finally transferred through the second outer layer to the light exit window formed by layer of layer 456. The first outer layer and the second outer layer are of a light transmitting polymeric material and have an oxygen transmission rate lower than 30 $cm^3/(m^2 \cdot day)$ (STP). The luminescent layer comprises a matrix polymer and a luminescent material being configured to absorb light according to an absorption spectrum and to convert a portion of the absorbed light towards light of a light emission spectrum.

As mentioned above, the light emitter may be a light emitting diode (LED). Other solid state light sources may be used as well, such as an Organic Light Emitting diode(s) OLEDs, or a laser diode. In some embodiments the solid state light source may be a blue light emitting LED, such as GaN or InGaN based LED, for example emitting primary light of the wavelength range from 440 to 460 nm. Alternatively, the solid state light source may emit UV or violet light which is subsequently converted into light of longer wavelength(s) by one or more wavelength converting materials. Nevertheless, the LED might also be a direct phosphor converted LED. For instance, a pc-LED having a CCT of 5,000 up to 20,000K can be used.

Figure 5A:
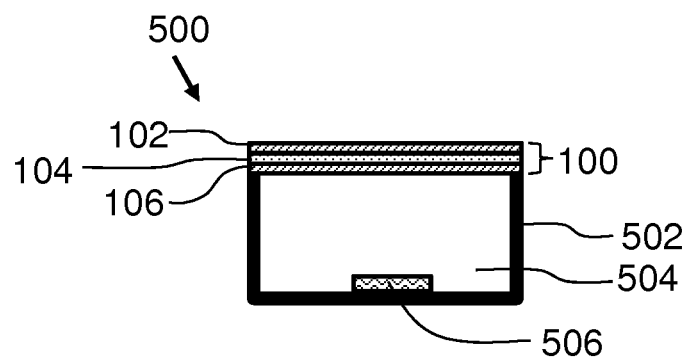
FIG. 5a presents in a cross-sectional view a lighting unit which comprises a stack of layers according to the invention.

FIG. 5a presents in a cross-sectional view a lighting unit 500 which comprises a stack 100 of layers according to the invention. The lighting unit 500 comprises a housing 502 which encloses a light mixing cavity 504. Inside the light mixing cavity 504 is arranged a light emitter 506, which is, for example, a solid state light emitter. Examples of solid state light emitters are Light Emitting Diodes (LEDs), Organic Light Emitting diode(s) OLEDs, or, for example, laser diodes. The light emitter 506 emits light towards a light exit window of the light mixing cavity 504. At the light exit window is arranged the stack 100 of layers which corresponds to the stack of layers 100 of FIG. 1. It is to be noted that other embodiments of the stack of layer of, for example, FIG. 3 can also be used in the lighting unit 500. In an embodiment, the surface of the housing 502, which is facing the light mixing chamber 504, is light reflective. The surface may be diffusely or specular light reflective. In yet another embodiment, the reflectivity of the surface is at least 80%. In another embodiment, the reflectivity of the surface is at least 90%.

Figure 5B:
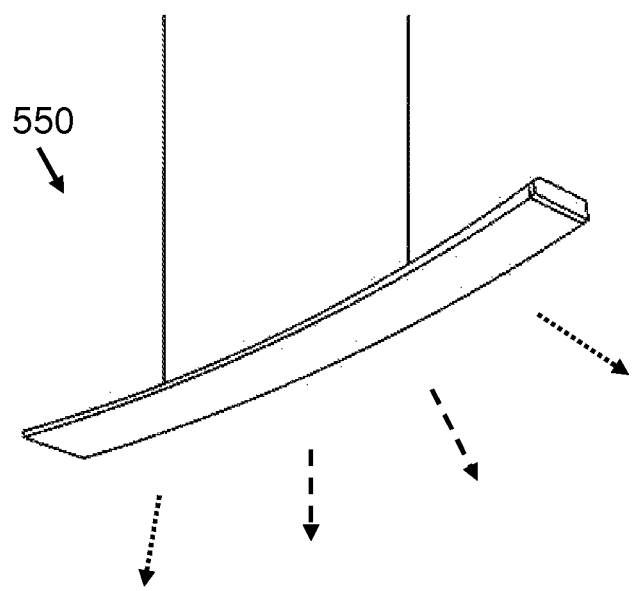
FIG. 5b presents a luminaire according to the third aspect of the invention.

FIG. 5b presents a luminaire 550 according to the third aspect of the invention. The luminaire comprises a stack of layer according to the first aspect of the invention (not shown), a lamp according to the second aspect of the invention (not shown) or one or more the lighting units 500 of FIG. 5a.

Figure 6:
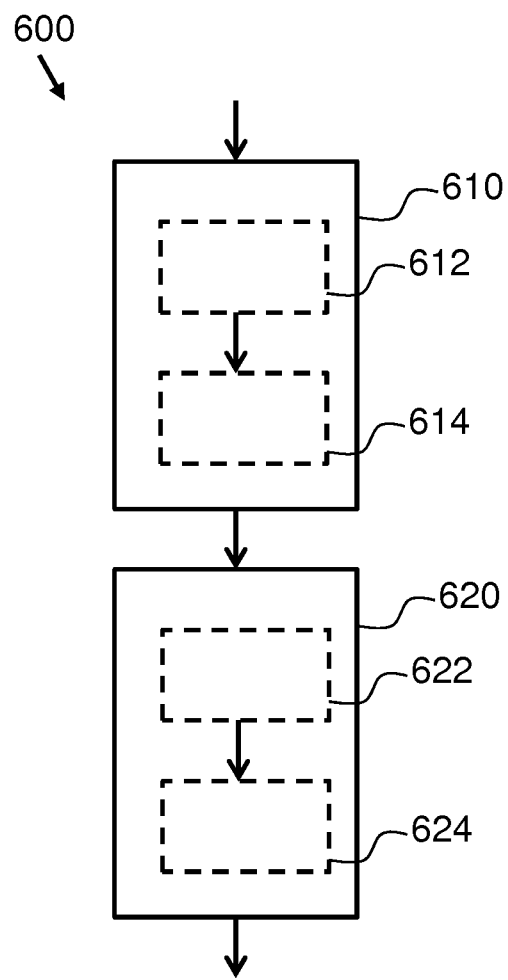
FIG. 6 presents a method of manufacturing a stack of layers.

FIG. 6 presents a method 600 of manufacturing a stack of layers. The method 600 comprises the steps of i) manufacturing 610 a luminescent layer of a matrix polymer comprising luminescing material—the luminescent material is configured to absorb light according to an absorption spectrum and to convert a portion of the absorbed light towards light of a light emission spectrum ii) applying 620 a first outer layer and applying a second outer layer on opposite sides of the luminescent layer—the first outer layer and the second outer layer are of a light transmitting polymeric material and have an oxygen transmission rate lower than 30 $cm^3/(m^2 \cdot day)$ (STP).

The manufacturing 610 of the luminescent layer may comprise the substeps of a) mixing 612 luminescent material with the matrix polymer and b) creating 614 a layer of the mix. Creating 614 a layer may be done by using an extrusion process, by injection molding or extrusion or by spreading the mix along a surface and curing the mix. The step of applying 620 a first outer layer and applying a second outer layer on both sides of the luminescent layer comprises c) applying 622 the first outer layer to one surface of the luminescent layer and d) applying 624 the second outer layer to an opposite surface of the luminescent layer. The applying 620 of the layers may be performed by using lamination techniques, co-injection molding or co-extrusion.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:
1. A stack of layers comprising
   a first outer layer,
   a second outer layer, the first outer layer and the second outer layer are of a light transmitting polymeric material and have an oxygen transmission rate lower than 30 cm3/(m2·day) under standard temperature and pressure (STP), and
   a luminescent layer being sandwiched between the first outer layer and the second outer layer, the luminescent layer comprises a light transmitting matrix polymer and a luminescent material being configured to absorb light according to an absorption spectrum and convert a portion of the absorbed light towards light of a light emission spectrum.
2. A stack of layers according to claim 1, wherein the material of the first outer layer and the material of the second outer layer have an oxygen permeability lower than 3 cm3·mm/(m2·day·bar).

3. A stack of layers according to claim 1, wherein the luminescent material comprises at least one of an organic phosphor, a quantum dot, a quantum rod or a quantum tetrapod.

4. A stack of layers according to claim 1, wherein the luminescent layer comprises a further luminescent material being configured to absorb light according to a further absorption spectrum and convert a portion of the absorbed light towards light of a further light emission spectrum.

5. A stack of layers according to claim 3, wherein the luminescent material and the further luminescent material are provided as a mix of materials in a single layer, or wherein the luminescent material is provided in a first sub-layer and the further luminescent material is provided in a second sub-layer.

6. A stack of layers according to claim 1, wherein the light transmitting polymeric material comprises at least one of: poly ethylene terephthalate—PET, poly ethylene naphtalate—PEN, poly vinylidene chloride—PVDC, poly vinylidene fluoride—PVDF, ethylene vinyl alcohol—EVOH, polybutylene terephthalate—PBT, poly acrylo nitrile—PAN and nylon6—PA6.

7. A stack of layers according to claim 1, wherein the matrix polymer comprises at least one of: poly ethylene terephthalate—PET, poly methylmethacrylate—PMMA, poly carbonate—PC.

8. A stack of layers according to claim 1, wherein the light transmitting polymeric material and the matrix polymer comprise the same polymeric material.

9. A stack of layers according to claim 8, wherein the light transmitting polymeric material and the matrix polymer comprises poly ethylene terephthalate—PET.

10. A stack of layers according to claim 1, wherein the first outer layer and/or the luminescent layer further comprises particles of at least one of the groups of scattering particles, lifetime improvement particles and inorganic phosphors.

11. A lamp comprising a light emitter and a stack of layers according to claim 1 arranged to receive light from the light emitter.

12. A luminaire comprising a stack of layers according to claim 1 or comprising a lamp.

13. A method of manufacturing a stack of layers,
manufacturing a luminescent layer of a matrix polymer comprising luminescing material, the luminescent material is configured to absorb light according to an absorption spectrum and to convert a portion of the absorbed light towards light of a light emission spectrum,
applying a first outer layer and applying a second outer layer on opposite sides of the luminescent layer, the first outer layer and the second outer layer are of a light transmitting polymeric material and have an oxygen transmission rate lower than 30 cm3/(m2·day) under standard temperature and pressure (STP).

* * * * *